(12) United States Patent
Jeong et al.

(10) Patent No.: US 8,324,629 B2
(45) Date of Patent: Dec. 4, 2012

(54) ORGANIC LIGHT EMITTING DISPLAY DEVICE AND METHOD OF MANUFACTURING THE SAME

(75) Inventors: Jong-Han Jeong, Yongin (KR);
Eun-Hyun Kim, Yongin (KR);
Jae-Wook Kang, Yongin (KR);
Min-Kyu Kim, Yongin (KR); Yeon-Gon Mo, Yongin (KR)

(73) Assignee: Samsung Display Co., Ltd. (KR)

( * ) Notice: Subject to any disclaimer, the term of this patent is extended or adjusted under 35 U.S.C. 154(b) by 152 days.

(21) Appl. No.: 12/848,919

(22) Filed: Aug. 2, 2010

(65) Prior Publication Data

US 2011/0108831 A1 May 12, 2011

(30) Foreign Application Priority Data

Nov. 10, 2009 (KR) ........................ 10-2009-0108081

(51) Int. Cl.
*H01L 27/14* (2006.01)

(52) U.S. Cl. ....... 257/72; 257/66; 257/88; 257/E33.067; 257/E33.064; 257/E29.273; 313/506; 438/149; 438/151

(58) Field of Classification Search .................... 257/40, 257/59, 66, 72, 88, 98, 99, 100, E33.067, 257/E33.064, E29.117, E29.273, 500; 313/506, 313/499, 500; 438/149, 151
See application file for complete search history.

(56) References Cited

U.S. PATENT DOCUMENTS

2010/0117085 A1* 5/2010 Lee .................................. 257/57

FOREIGN PATENT DOCUMENTS

| JP | 2009-099502 | 5/2009 |
|---|---|---|
| KR | 10-2007-0038331 | 4/2007 |
| KR | 10-2008-0006290 | 1/2008 |
| KR | 1020080082277 | 9/2008 |
| KR | 10-2008-0113782 | 12/2008 |
| KR | 10-0875101 | 12/2008 |
| KR | 1020090037725 | 4/2009 |
| KR | 1020090094067 | 9/2009 |

OTHER PUBLICATIONS

Office Action dated Nov. 3, 2011 in Korean Priority Patent Application No. 10-2009-0108081.
Korean Office Action dated Apr. 18, 2011 in Korean Priority Application No. 10-2009-0108081.
Yoo et al., "Study on Wet Chemical Etching Characterization of Zinc Oxide Film for Transparency Conductive Oxide Application", Journal of the Korean Vacuum Society, vol. 17, No. 1, Jan. 2008, pp. 73-79.

* cited by examiner

*Primary Examiner* — Eduardo A Rodela
(74) *Attorney, Agent, or Firm* — Knobbe Martens Olson & Bear LLP

(57) ABSTRACT

An organic light emitting display device and a method of manufacturing the device are disclosed. The method includes forming a layer over an oxide semiconductor layer to protect the oxide semiconductor layer from damage as further layers are formed and etched.

13 Claims, 3 Drawing Sheets

ORGANIC LIGHT EMITTING DISPLAY DEVICE AND METHOD OF MANUFACTURING THE SAME

CROSS-REFERENCE TO RELATED APPLICATIONS

This application claims priority to and the benefit of Korean Patent Application No. 10-2009-0108081, filed on Nov. 10, 2009, in the Korean Intellectual Property Office, the entire content of which is incorporated herein by reference.

BACKGROUND

1. Field

The field relates to an organic light emitting display device and a method of manufacturing the same, and further to an organic light emitting display device having a bottom emission structure and a method of manufacturing the same.

2. Description of the Related Technology

Organic light emitting elements emit light when holes injected from an anode electrode and electrons injected from a cathode electrode recombine in an organic light emitting layer. The holes and electrons are injected by applying a voltage difference across the anode electrode and the cathode electrode.

Since such organic light emitting elements have a self-emission feature, organic light emitting display devices can be manufactured to have a bottom emission structure in which emitted light travels to a substrate with a thin film transistor and a top emission structure in which light travels to over a thin film transistor.

Since light travels to the substrate with a thin film transistor in the bottom emission structure, the line connected to the thin film transistor is excepted from the display region, whereas since light travels over the thin film transistor in the top emission structure, a relatively wide display region can be ensured.

Nevertheless, organic light emitting display devices having a top emission structure requires more masks in the manufacturing process than those having the bottom emission structure, such that use of the bottom emission structure has been recently increased in consideration of reducing the manufacturing cost.

However, in the bottom emission structure, since the anode electrode made of a transparent electrode material is disposed adjacent to the surface of the substrate, the surface of the anode electrode under an upper layer is damaged by plasma etc., in etching the upper layer. When transparent electrode materials, such as ITO and IZO, are exposed to plasma, the indium (In) on the surface is removed and conductivity and transmittance are correspondingly reduced, and as a result, the light emission characteristics are reduced. Further, the surface roughness increases, which may causes defective products in the manufacturing process.

SUMMARY OF CERTAIN INVENTIVE ASPECTS

One aspect is an organic light emitting display device. The device includes a transparent substrate having a first region and a second region, and an anode electrode in the first region, where the anode electrode includes a transparent material. The device also includes a gate electrode in the second region, where the gate electrode includes the transparent material and an oxide semiconductor material, and an insulating layer formed on the anode electrode and the gate electrode, where the insulating layer is patterned to expose the anode electrode in a light emitting region. The device also includes an active layer formed on a portion of the insulating layer over the gate electrode, where the active layer includes the oxide semiconductor material and includes a channel region, a source region, and a drain region. The device also includes a first passivation film formed on the insulating layer and the active layer, where the first passivation film is patterned to expose the active layer in the source and drain regions and to expose the anode electrode in the light emitting region, where the first passivation film remains on the channel region of the active layer. The device also includes a source electrode connected to the exposed anode electrode and to the exposed active layer in the source region, a drain electrode connected to the exposed active layer in the drain region, an organic light emitting layer that is formed on the exposed anode electrode, and a cathode electrode that is formed on the organic light emitting layer.

Another aspect is a method of manufacturing an organic light emitting display device. The method includes providing a transparent substrate having a first region and a second region, and forming an anode electrode in the first region and a gate electrode in the second region, where the anode electrode and the gate electrode each include a transparent material layer and an oxide semiconductor material layer. The method also includes forming an insulating layer on the anode electrode and the gate electrode, forming an active layer on the insulating layer over the gate electrode, where the active layer includes the oxide semiconductor material and includes a channel region, a source region, and a drain region. The method also includes exposing portions of source and drain regions of the active layer and a portion of the anode electrode after forming a first passivation film on the insulating layer, and forming a source electrode on the first passivation film, where the source electrode is connected to the source region of the active layer and to the exposed anode electrode. The method also includes forming a drain electrode on the first passivation film, where the drain electrode is connected to the drain region of the active layer, forming a second passivation film on the first passivation film, the source electrode, and the drain electrode, exposing the oxide semiconductor of the anode electrode by sequentially etching the second passivation film, the first passivation film, and the insulating layer, exposing the transparent electrode material of the anode electrode by etching the exposed oxide semiconductor, forming an organic light emitting layer on the exposed transparent material, and forming a cathode electrode on the organic light emitting layer.

Another aspect is a method of manufacturing an organic light emitting display device. The method includes forming a light emitting device on a substrate, and forming a transistor on the substrate, where forming the transistor includes forming a gate on the substrate, forming an insulating layer over the gate, forming an active layer over the insulating layer, where the active layer includes an oxide semiconductor material and includes and includes a channel region, a source region, and a drain region, forming a first passivation film over the active layer, and patterning the first passivation film to expose the source and drain regions of the active layer, where the first passivation film remains over the channel region of the active layer, and forming an electrode over the first passivation film, where the electrode connects the light emitting device and the transistor.

BRIEF DESCRIPTION OF THE DRAWINGS

The accompanying drawings, together with the specification illustrate exemplary embodiments, and serve to explain various inventive principles and embodiments.

DETAILED DESCRIPTION OF CERTAIN INVENTIVE EMBODIMENTS

Figure 1:
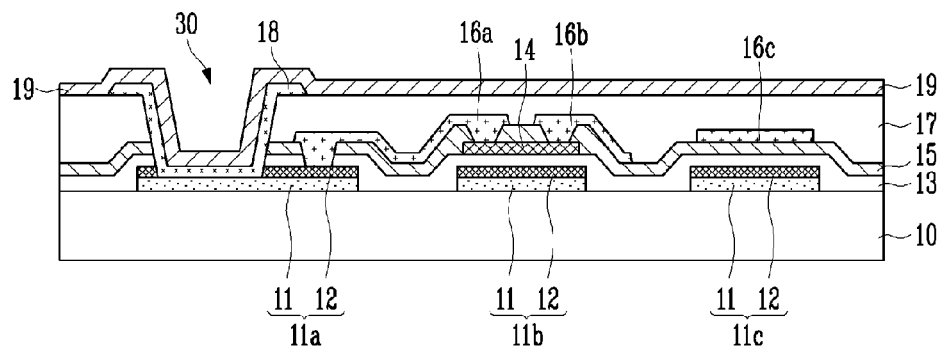
FIG. 1 is a cross-sectional view illustrating an organic light emitting display device according to some embodiments.

In the following detailed description, only certain exemplary embodiments have been shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals generally refer to like elements.

Certain embodiments of the present invention will be described hereafter with reference to the accompanying drawings. The following embodiments are provided for those skilled in the art to sufficiently understand various inventive aspects and can be modified in various ways. Further the scope of the present invention is not limited to the following embodiments.

FIG. 1 is a schematic a cross-sectional view illustrating an organic light emitting display device according to some embodiments.

Figure 2A:
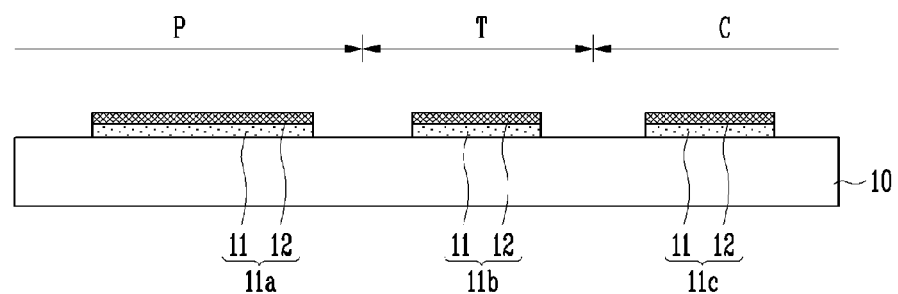
FIGS. 2A to 2H are cross-sectional views illustrating a method of manufacturing an organic light emitting display device.

Referring to FIGS. 1 and 2A, a substrate 10 is made of transparent glass, plastic, or the like, and a pixel forming region 'P' includes a thin film transistor forming region 'T' and a capacitor forming region 'C', in order to a achieve a bottom emission structure. An anode electrode 11a, a gate electrode 11b, and a bottom electrode 11c are formed on the pixel forming region 'P', the thin film transistor forming region 'T', and the capacitor forming region 'C', respectively. The anode electrode 11a includes a transparent electrode layer 11 and an oxide semiconductor layer 12 formed on the transparent electrode layer outside a light emitting region 30, and the gate electrode 11b and the bottom electrode 11c are also respectively composed of the transparent electrode layer 11 and the oxide semiconductor layer 12 which are stacked.

An insulating layer 13 is formed on the anode electrode 11a, and the gate electrode 11b, and the bottom electrode 11c and a via-hole is formed in the insulating layer 13 to expose the anode electrode 11a in the light emitting region 30.

An active layer 14, formed of an oxide semiconductor layer provides a channel region, a source region, and a drain region of the thin film transistor. The active layer 14 is formed on the insulating layer 13 over the gate electrode 11b. A first passivation film 15 is formed on the insulating layer. the first passivation film 15 has a contact hole, which exposes the active layer 14 of the source and drain regions, and a via-hole, which exposes the anode electrode 11a of the light emitting region 30. A source electrode 16a is connected to both the active layer 14 and the anode electrode 11a, and a drain electrode 16b is connected to the active layer 14 of the exposed drain region.

A second passivation film 17 is formed on the first passivation film 15, for planarization and insulation, and a via-hole is formed in the second passivation film 17 to expose the anode electrode 11a of the light emitting region 30.

An organic light emitting layer 18 is formed on the anode electrode 11a exposed by the via-hole and a cathode electrode 19 is formed on the second passivation film 17 and the organic light emitting layer 18.

An organic light emitting display device having the above configuration emits light when holes injected through the anode electrode 11a and electrons injected through the cathode electrode 19 recombine in the organic light emitting layer 18. The holes and electrons are injected by applying a voltage difference across the anode electrode 11a and the cathode electrode 19. The light emitted from the light emitting region 30 travels outside through the substrate 10.

A manufacturing process of the organic light emitting display device having the above configuration is describe with reference to FIGS. 2A to 2H.

FIGS. 2A to 2H are cross-sectional views illustrating a method of manufacturing an organic light emitting display device according to some embodiments.

Referring to FIG. 2A, a transparent substrate 10 that is made of, for example, glass or plastic includes a pixel forming region 'P', a thin film transistor forming region 'T', and a capacitor region 'C'. A transparent electrode layer 11 and an oxide semiconductor layer 12 are sequentially formed on the substrate 10, and an anode electrode 11a is formed in the pixel forming region 'P', a gate electrode 11b is formed in the thin film transistor forming region 'T', and a bottom electrode 11c is formed in the capacitor forming region 'C', by patterning the oxide semiconductor layer 12 and the transparent electrode layer 11.

The transparent electrode layer 11 is made of, for example, ITO, IZO etc. The oxide semiconductor layer 12 is made of, for example, zinc oxide (ZnO), or ZnGaO, ZnInO, ZnSnO, GaInZnO, and HfInZnO etc., which are created by doping with, for example, at least one ion of gallium (Ga), indium (In), tin (Sn), zirconium (Zr), hafnium (Hf), and vanadium (V).

Figure 2B:
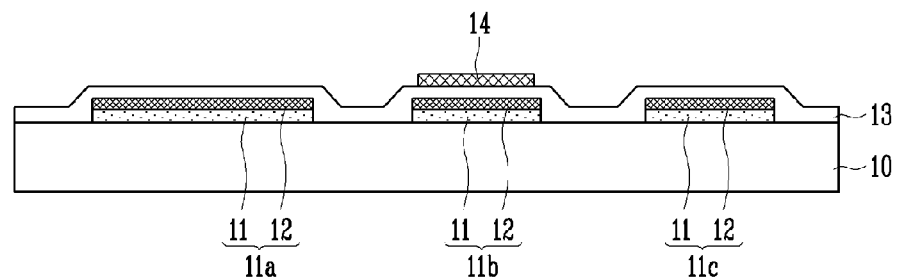

Referring to FIG. 2B, an insulating layer 13 and an oxide semiconductor layer are sequentially formed on the substrate 10, the anode electrode 11a, the gate electrode 11b, and the bottom electrode 11c. Subsequently, an active layer 14, which provides source and drain regions and a channel region of the thin film transistor, is formed on the insulating layer 13 over the gate electrode 11b, by patterning the oxide semiconductor layer.

The insulating layer 13 is made of, for example, silicon oxide SiOx or silicon nitride SiNx and the oxide semiconductor layer is made of, for example, zinc oxide (ZnO), or ZnGaO, ZnInO, ZnSnO, GaInZnO, and HfInZnO etc., which are created by doping with, for example, at least one ion of gallium (Ga), indium (In), tin (Sn), zirconium (Zr), hafnium (Hf), and vanadium (V).

Figure 2C:
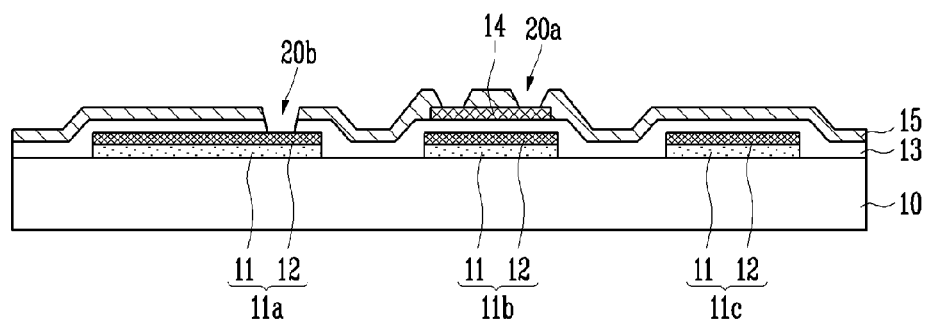

Referring to FIG. 2C, a first passivation layer 15, made of an inorganic material, is formed on the insulating layer 13 and the active layer 14 and contact holes 20a and 20b are formed in the first passivation layer 15 to expose portions of the active layer 14 for source and drain regions and the anode electrode 11a.

Figure 2D:
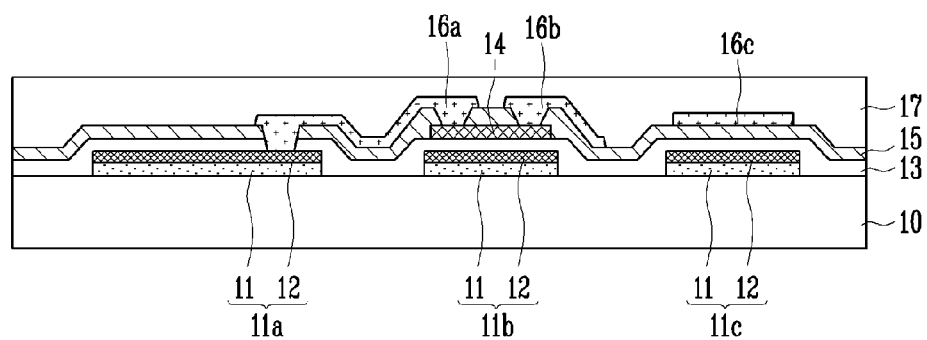

Referring to FIG. 2D, a metal layer is made of, for example, Mo, MoW, Al, AlAd, or AlLiLa etc. on the first passivation layer 15 to fill the contact holes 20a and 20b, and then source electrode and drain electrode 16a and 16b, which are connected to the active region 14 of the source region and the drain region, and a top electrode 16c overlapping the bottom electrode 11c are formed by patterning the metal layer. The source electrode 16a or the drain electrode 16b is connected to the anode electrode 11b through the contact hole 20b. A second passivation layer 17 is formed on the source electrode and the drain electrode 16a and 16b, for planarization and insulation.

The active layer 14 in the channel region is exposed to plasma and damaged when dry etching to pattern the source electrode and the drain electrode 16a and 16b. As the oxide semiconductor layer is exposed to the plasma, the surface is damaged and oxygen is removed, such that the electrical characteristics are compromised by the decrease of specific resistance caused by increase in the density of carriers. Therefore, according to an embodiment, it is possible prevent electrical characteristics of the active layer 14 from be deteriorated by making the first passivation film 15 function as an etch stop layer such that the active layer 14 in the channel region is protected.

Figure 2E:
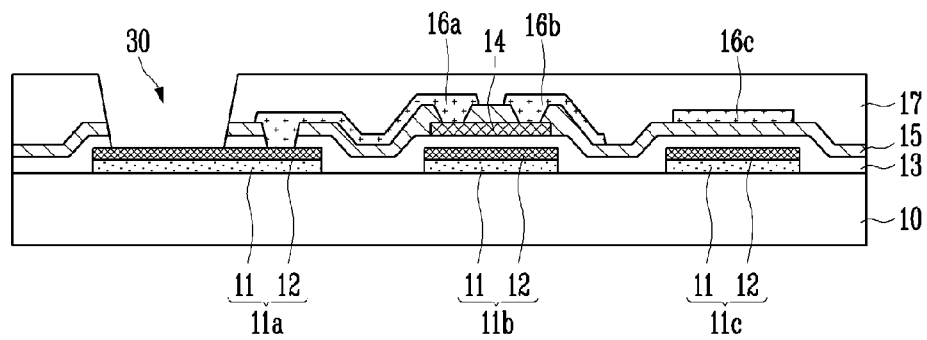
Figure 2F:
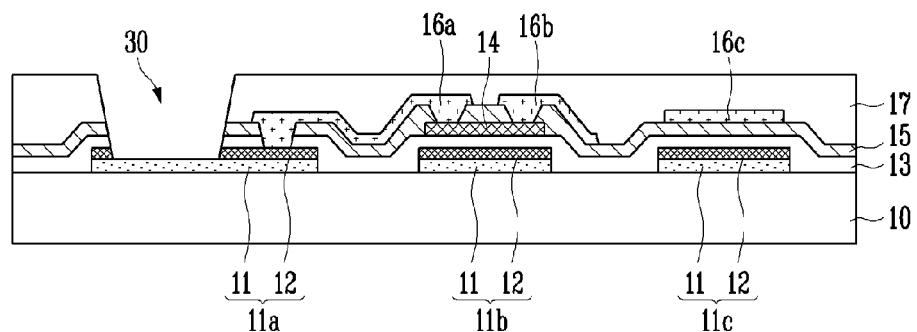

Referring to FIGS. 2E and 2F, the anode electrode 11a in the light emitting region 30 is exposed by sequentially removing the second passivation film 17, the first passivation film 15, and the insulating layer 13, using dry etching with a predetermined mask (see FIG. 2E), and the exposed oxide semiconductor layer 12 in the light emitting region 30 is removed by dry etching (see FIG. 2F).

Since the transparent electrode material, such as ITO, has low etching selectivity with respect to an insulating layer, when the anode electrode 11a is a single layer formed of the transparent electrode layer 11, the surface of the transparent electrode surface 11 is damaged by plasma in dry etching for removing the insulating layer 13. When the surface of ITO is exposed to the plasma, indium (In) is removed, such that conductivity and transmittance are reduced and the surface roughness increases.

Therefore, according to some embodiments, the anode electrode 11a is composed of the transparent electrode layer 11 and the oxide semiconductor layer 12 which are stacked. The oxide semiconductor layer 12 has higher etching selectivity than the transparent electrode layer 11, such that the transparent electrode layer 11 is protected in etching the insulating layer 13, and is not damaged. Further, since the anode electrode 11a, the gate electrode 11b, and the bottom electrode 11c are formed on the same layer in the same plane by one mask, it is possible to reduce the number of masks that are used in the manufacturing process.

Figure 2G:
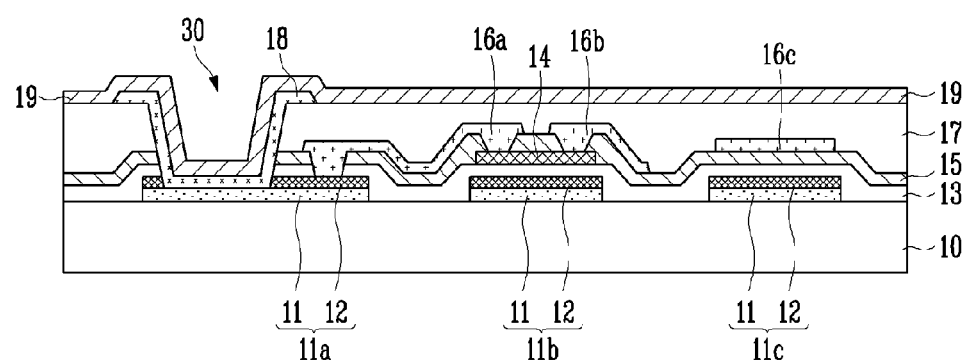

Referring to FIG. 2G, an organic light emitting layer 18 is formed on the exposed anode electrode 11a in the light emitting region 30, and then a cathode electrode 19 is formed on the second passivation layer 17 and the organic light emitting layer 18.

Figure 2H:
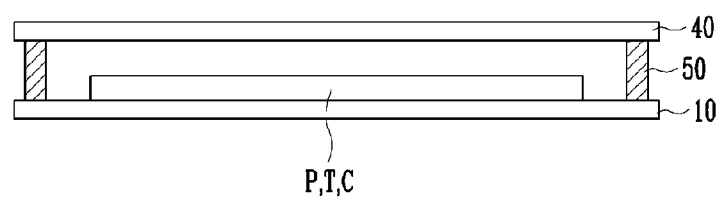

Referring to FIG. 2H, an encapsulation substrate 40 for sealing is disposed on the substrate with an organic light emitting element including the anode electrode 11a, the organic light emitting layer 18, and the cathode electrode 19 in the pixel forming region 'P', a thin film transistor including the gate electrode 11b, the active layer 14, and the source and drain electrodes 16a and 16b in the thin film transistor forming region 'T', and a capacitor including the bottom electrode 11c, the dielectric layers 13 and 15, and the top electrode 16c in the capacitor forming region 'C', and an organic light emitting display device is further formed by bonding the encapsulation substrate 40 to the substrate 10 with a sealant.

While certain exemplary embodiments have been described, it is to be understood that the invention is not limited to the disclosed embodiments, but, on the contrary, is intended to cover various modifications and equivalent arrangements.

What is claimed is:

1. An organic light emitting display device, comprising:
a transparent substrate having a first region and a second region;
an anode electrode in the first region, wherein the anode electrode comprises a transparent material;
a gate electrode in the second region, wherein the gate electrode comprises the transparent material and an oxide semiconductor material;
an insulating layer formed on the anode electrode and the gate electrode, wherein the insulating layer is patterned to expose the anode electrode in a light emitting region;
an active layer formed on a portion of the insulating layer over the gate electrode, wherein the active layer comprises the oxide semiconductor material and includes a channel region, a source region, and a drain region;
a first passivation film formed on the insulating layer and the active layer, wherein the first passivation film is patterned to expose the active layer in the source and drain regions and to expose the anode electrode in the light emitting region, wherein the first passivation film remains on the channel region of the active layer;
a source electrode connected to the exposed anode electrode and to the exposed active layer in the source region;
a drain electrode connected to the exposed active layer in the drain region;
an organic light emitting layer that is formed on the exposed anode electrode; and
a cathode electrode that is formed on the organic light emitting layer.

2. The organic light emitting display device as claimed in claim 1, wherein the anode electrode further includes the oxide semiconductor material on the transparent electrode material outside the light emitting region.

3. The organic light emitting display device as claimed in claim 1, wherein the oxide semiconductor material includes zinc oxide (ZnO).

4. The organic light emitting display device as claimed in claim 3, wherein the oxide semiconductor material is doped with at least one of gallium (Ga), indium (In), tin (Sn), zirconium (Zr), hafnium (Hf), and vanadium (V).

5. The organic light emitting display device as claimed in claim 1, wherein the transparent electrode material comprises at least one of ITO and IZO.

6. The organic light emitting display device as claimed in claim 1, wherein the first passivation film comprises an inorganic material.

7. A method of manufacturing an organic light emitting display device, the method comprising:
providing a transparent substrate having a first region and a second region;
forming an anode electrode in the first region and a gate electrode in the second region, wherein the anode electrode and the gate electrode each comprise a transparent material layer and an oxide semiconductor material layer;
forming an insulating layer on the anode electrode and the gate electrode;
forming an active layer on the insulating layer over the gate electrode, wherein the active layer comprises the oxide semiconductor material and includes a channel region, a source region, and a drain region;
exposing portions of source and drain regions of the active layer and a portion of the anode electrode after forming a first passivation film on the insulating layer;

forming a source electrode on the first passivation film, wherein the source electrode is connected to the source region of the active layer and to the exposed anode electrode;

forming a drain electrode on the first passivation film, wherein the drain electrode is connected to the drain region of the active layer;

forming a second passivation film on the first passivation film, the source electrode, and the drain electrode;

exposing the oxide semiconductor of the anode electrode by sequentially etching the second passivation film, the first passivation film, and the insulating layer;

exposing the transparent electrode material of the anode electrode by etching the exposed oxide semiconductor;

forming an organic light emitting layer on the exposed transparent material; and forming a cathode electrode on the organic light emitting layer.

8. The method of manufacturing an organic light emitting display device as claimed in claim 7, wherein the transparent electrode material is one of ITO and IZO.

9. The method of manufacturing an organic light emitting display device as claimed in claim 7, wherein the oxide semiconductor material comprises zinc oxide (ZnO).

10. The method of manufacturing an organic light emitting display device as claimed in claim 9, wherein the oxide semiconductor material is doped with at least one of gallium (Ga), indium (In), tin (Sn), zirconium (Zr), hafnium (Hf), and vanadium (V).

11. The method of manufacturing an organic light emitting display device as claimed in claim 7, wherein the first passivation film comprises an inorganic material.

12. The method of manufacturing an organic light emitting display device as claimed in claim 7, wherein the first passivation film and the insulating layer are etched by dry etching.

13. The method of manufacturing an organic light emitting display device as claimed in claim 7, wherein the oxide semiconductor material is etched by wet etching.

* * * * *